United States Patent
Wadatsumi et al.

(10) Patent No.: US 7,705,663 B2
(45) Date of Patent: Apr. 27, 2010

(54) SEMICONDUCTOR INTEGRATED CIRCUIT

(75) Inventors: Junji Wadatsumi, Tokyo (JP); Shouhei Kousai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 4 days.

(21) Appl. No.: 12/051,026

(22) Filed: Mar. 19, 2008

(65) Prior Publication Data
US 2008/0258779 A1    Oct. 23, 2008

(30) Foreign Application Priority Data
Mar. 20, 2007    (JP) .............................. 2007-072542

(51) Int. Cl.
*G05F 1/10* (2006.01)
(52) U.S. Cl. .................. 327/543; 327/541; 327/538
(58) Field of Classification Search ................. 327/53, 327/530, 538–543; 323/315, 316, 312, 313; 330/288, 257
See application file for complete search history.

(56) References Cited

U.S. PATENT DOCUMENTS

| | | | |
|---|---|---|---|
| 4,992,755 A * | 2/1991 | Seevinck et al. | 330/253 |
| 6,587,000 B2 | 7/2003 | Oikawa | |
| 7,230,474 B2 | 6/2007 | Yamaoto et al. | |
| 2003/0102924 A1* | 6/2003 | Matsumoto et al. | 330/310 |
| 2006/0202763 A1 | 9/2006 | Niki et al. | |

FOREIGN PATENT DOCUMENTS

JP    2006-254118    9/2006

* cited by examiner

*Primary Examiner*—Long Nguyen
*Assistant Examiner*—Sibin Chen
(74) *Attorney, Agent, or Firm*—Oblon, Spivak, McClelland, Maier & Neustadt, L.L.P.

(57) ABSTRACT

A semiconductor integrated circuit, has a current source having one end connected to a power supply and outputting a reference current; a first MOS transistor having one end connected to an other end of the current source and being diode-connected; a second MOS transistor having a gate connected to a gate of the first MOS transistor and passing an output current obtained by current-mirroring the reference current; a first variable resistor connected between an other end of the first MOS transistor and a ground; a resistive component connected between an other end of the second MOS transistor and the ground; and a first operational amplifier fed with a first potential of the other end of the first MOS transistor and a second potential of the other end of the second MOS transistor and outputting a signal for controlling a resistance value of the first variable resistor to equalize the first potential and the second potential, wherein the resistance value of the first variable resistor is controlled based on the output signal of the first operational amplifier.

7 Claims, 3 Drawing Sheets

SEMICONDUCTOR INTEGRATED CIRCUIT

CROSS-REFERENCE TO RELATED APPLICATION

This application is based upon and claims the benefit of priority from the prior Japanese Patent Application No. 2007-72542, filed on Mar. 20, 2007, the entire contents of which are incorporated herein by reference.

BACKGROUND OF THE INVENTION

1. Field of the Invention

The present invention relates to a semiconductor integrated circuit having a current mirror circuit.

2. Background Art

Current mirror circuits are conventional circuits that generate the reproductions of reference currents and have been widely used for biases and so on in analog circuits.

A reference current is copied by applying, to the gate of a second n-type MOS transistor, a gate potential generated at the application of the reference current of a first n-type MOS transistor that is diode-connected. When voltages applied between the gates and sources are equal to each other and these MOS transistors operate in a saturation region, currents applied to these MOS transistors are equalized (in this case, a channel length modulation effect is ignored).

However, for example, when a resistive component is present between the source and ground of the second n-type MOS transistor, a current is applied to the node of the source and the ground and thus voltages between the gates and sources of the MOS transistors may be different from each other.

Also when a ground line has a parasitic resistance component and so on, for example, when the two MOS transistors are separated from each other on the layout, voltages between the gates and sources of the MOS transistors may be different from each other.

When voltages between the gates and sources of these MOS transistors are different from each other, the MOS transistors do not operate based on the same operating point, so that the reference current cannot be correctly mirrored.

The mismatch of the current mirror can be avoided by careful consideration of the layout, for example, by closely interconnecting the MOS transistors that serve as a source and a destination of mirroring.

In some cases, a current mirror circuit may be used for, for example, the bias of a common-source amplifier. For example, in the case of degeneration using a resistor, a resistor causing the same voltage drop as the transistor serving as the destination is inserted into the transistor serving as the source of mirroring, so that voltages between the gates and sources of the two MOS transistors are kept equal.

However, in the case of inductive degeneration used for a low noise amplifier (LNA) with an inductance composed of a metal wire, the compensation is difficult. For example, the source of the MOS transistor serving as the source of mirroring has to have a resistance equivalent to a multiple of the mirror ratio of a resistance between the source and the ground of an amplifier. The inductance using a metal wire generally has a spiral configuration that is several tens of μm to several hundreds of μm in diameter. The metal wire has a parasitic resistor (a resistive component of several ohms to several tens of ohms).

In other words, when the resistor inserted in the source of mirroring is obtained by the same metal wire, an extremely large region is necessary only for the wire and is not suitable for practical use.

In another method, a resistance equivalent to the resistance value of the inductance is obtained by a poly resistor and the like. However, when the changing characteristics of the resistance value vary with a process, a temperature, and so on, the reference current cannot be correctly mirrored.

Thus in a conventional semiconductor integrated circuit, the drain voltages of two n-type MOS transistors composing a current mirror circuit are inputted to the differential input terminal of an operational amplifier, and the output voltage of the operational amplifier is applied to the gate of a MOS transistor serving as a variable resistor connected to the drain of the n-type MOS transistor serving as the destination of mirroring. With this configuration, the operational amplifier adjusts the drain voltages of the two n-type MOS transistors composing the current mirror circuit to the same voltage (e.g., see Japanese Patent Laid-Open No. 2006-254118).

According to the conventional semiconductor integrated circuit, the influence of the channel length modulation effect can be reduced and the minimum permissible voltage for an output voltage can be set lower.

However, when a resistive component such as a spiral inductor made up of a metal wire is present between a ground potential and the source of the n-type MOS transistor serving as the destination of mirroring, the conventional semiconductor integrated circuit cannot compensate for a voltage difference between the gates and sources.

SUMMARY OF THE INVENTION

According to one aspect of the present invention, there is provided: a semiconductor integrated circuit, comprising:

a current source having one end connected to a power supply and outputting a reference current;

a first MOS transistor having one end connected to an other end of the current source and being diode-connected;

a second MOS transistor having a gate connected to a gate of the first MOS transistor and passing an output current obtained by current-mirroring the reference current;

a first variable resistor connected between an other end of the first MOS transistor and a ground;

a resistive component connected between an other end of the second MOS transistor and the ground; and a first operational amplifier fed with a first potential of the other end of the first MOS transistor and a second potential of the other end of the second MOS transistor and outputting a signal for controlling a resistance value of the first variable resistor to equalize the first potential and the second potential, wherein the resistance value of the first variable resistor is controlled based on the output signal of the first operational amplifier.

DETAILED DESCRIPTION

Exemplary embodiments of the present invention will now be described in accordance with the accompanying drawings.

First Embodiment

Figure 1:
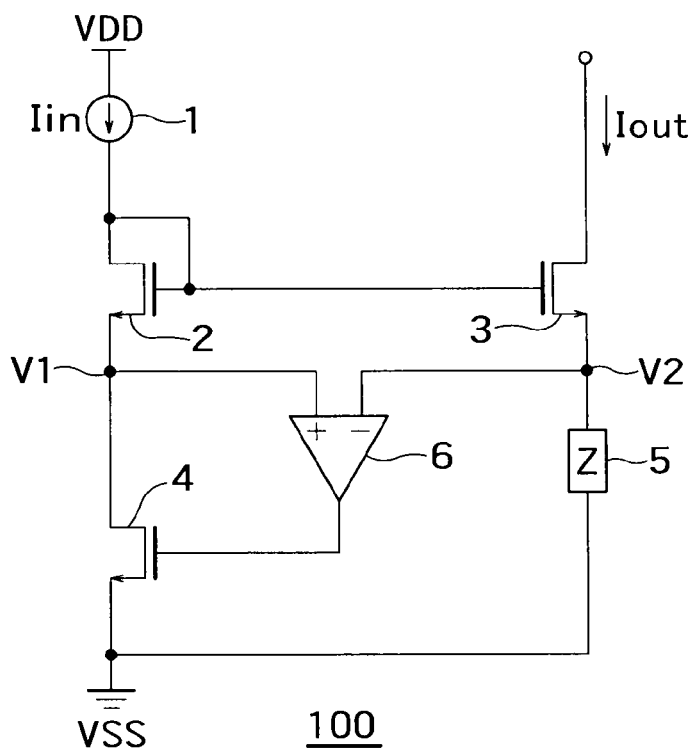
FIG. 1 shows the main configuration of a semiconductor integrated circuit 100 according to a first embodiment which is an aspect of the present invention.

FIG. 1 shows the main configuration of a semiconductor integrated circuit 100 according to a first embodiment which is an aspect of the present invention.

As shown in FIG. 1, the semiconductor integrated circuit 100 includes a current source 1 having one end connected to a power supply VDD and outputting a reference current Iin, a first MOS transistor 2 having one end (drain) connected to the other end of the current source 1 and acting as an n-type MOS transistor that is diode-connected, and a second MOS transistor 3 having the gate connected to the gate of the first MOS transistor 2 and acting as an n-type MOS transistor passing an output current Iout obtained by current-mirroring the reference current Iin.

The first MOS transistor 2 has a sufficiently large size to minimize, e.g., an input offset.

In the present embodiment, a channel length modulation effect caused by the fluctuations of the drain potential of the second MOS transistor 3 is ignored.

The semiconductor integrated circuit 100 further includes a first variable resistor 4 connected between the other end (source) of the first MOS transistor 2 and a ground VSS and a resistive component 5 connected between the other end (source) of the second MOS transistor 3 and the ground VSS.

The first variable resistor 4 is, for example, a MOS transistor that is turned on/off in response to a signal inputted to the gate.

The resistive component 5 is, for example, an inductor (e.g., a spiral inductor) made up of a metal wire in the inductive degeneration of an LNA. For example, when the first and second MOS transistors 2 and 3 are separated from each other on the layout, the resistive component 5 may be a parasitic resistance component on a ground line.

The semiconductor integrated circuit 100 further includes a first operational amplifier 6 having the non-inverting input terminal connected to the other end (source) of the first MOS transistor 2, the inverting input terminal connected to the other end (source) of the second MOS transistor 3, and the output connected to the gate of the MOS transistor composing the first variable resistor 4.

The first operational amplifier 6 compares a first potential V1 on the other end (source) of the first MOS transistor 2 and a second potential V2 on the other end (source) of the second MOS transistor 3 and outputs a signal for controlling the resistance value of the first variable resistor 4 to equalize the first potential V1 and the second potential V2.

In other words, the first operational amplifier 6 controls the first variable resistor 4 to reduce the resistance value when the first potential V1 is higher than the second potential V2 and to increase the resistance value when the first potential V1 is lower than the second potential V2.

For example, when the first variable resistor 4 is made up of a MOS transistor, the on resistance of the MOS transistor changes in the above described manner in response to the output signal of the first operational amplifier 6. The active region of the MOS transistor is determined by the first and second potentials V1 and V2, the size of the MOS transistor, and so on. The MOS transistor may operate in a linear region, a saturation region, and so on as long as the above function is obtained.

In this case, the first and second potentials V1 and V2 may come close to a ground potential. Therefore, it is desirable that the first operational amplifier 6 have a PMOS input and it is necessary to prevent the input/output potential from being deviated from the operating range of the operational amplifier.

Figure 2:
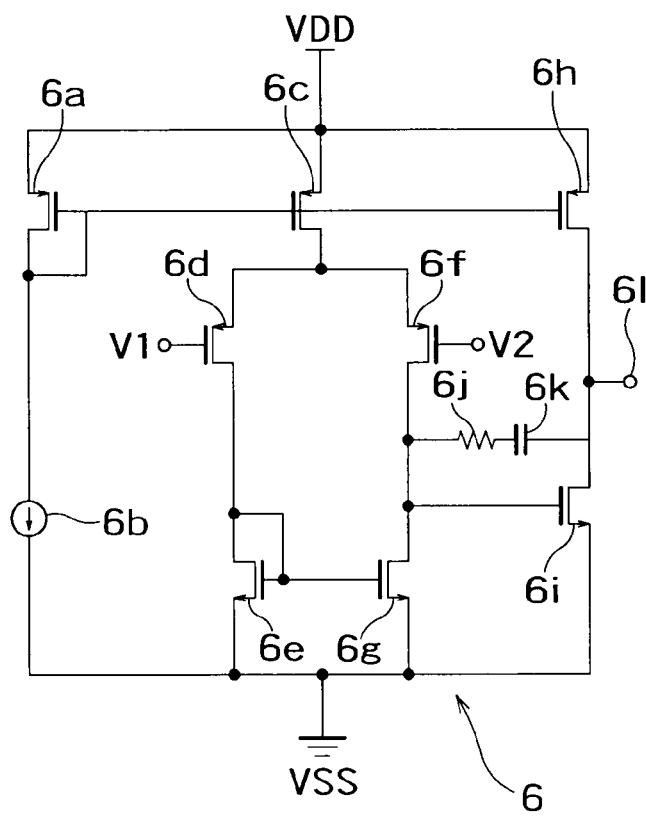
FIG. 2 shows an example of the main configuration of the first operational amplifier 6 having a PMOS input.

FIG. 2 shows an example of the main configuration of the first operational amplifier 6 having a pMOS input.

As shown in FIG. 2, the first operational amplifier 6 includes a p-type MOS transistor 6a having the source connected to the power supply VDD and the gate connected to the drain, a current source 6b having one end connected to the drain of the p-type MOS transistor 6a and the other end connected to the ground VSS, and a p-type MOS transistor 6c having the source connected to the power supply VDD and the gate connected to the gate of the p-type MOS transistor 6a.

The first operational amplifier 6 further includes a p-type MOS transistor 6d having the source connected to the drain of the p-type MOS transistor 6c and the gate fed with the first potential V1, an n-type MOS transistor 6e having the drain and gate connected to the drain of the p-type MOS transistor 6d and the source connected to the ground VSS, a p-type MOS transistor 6f having the source connected to the drain of the p-type MOS transistor 6c and the gate fed with the second potential V2, and an n-type MOS transistor 6g having the drain connected to the drain of the p-type MOS transistor 6f, the gate connected to the gate of the n-type MOS transistor 6e, and the source connected to the ground VSS.

The first operational amplifier 6 further includes a p-type MOS transistor 6h having the source connected to the power supply VDD and the gate connected to the gate of the p-type MOS transistor 6a, an n-type MOS transistor 6i having the drain connected to the drain of the p-type MOS transistor 6h, the gate connected to the drain of the p-type MOS transistor 6f, and the source connected to the ground VSS, a resistor 6j having one end connected to the drain of the p-type MOS transistor 6f, a capacitance 6k connected between the other end of the resistor 6j and the drain of the p-type MOS transistor 6h, and a terminal 6l connected to the drain of the p-type MOS transistor 6h to output a signal for controlling the first variable resistor 4.

The first operational amplifier 6 configured thus outputs the signal from the terminal 6l based on the first and second potentials V1 and V2 inputted to the p-type MOS transistors 6d and 6f, so that the MOS transistor composing the first variable resistor 4 is controlled to equalize the first and second potentials V1 and V2. In the first operational amplifier 6, the gates of the p-type MOS transistors 6d and 6f act as the inputs of the first operational amplifier 6. Thus even when the first and second potentials V1 and V2 come close to the ground potential, a desired operation can be performed.

The following will examine the output characteristics of the semiconductor integrated circuit 100 configured thus.

Figure 3:
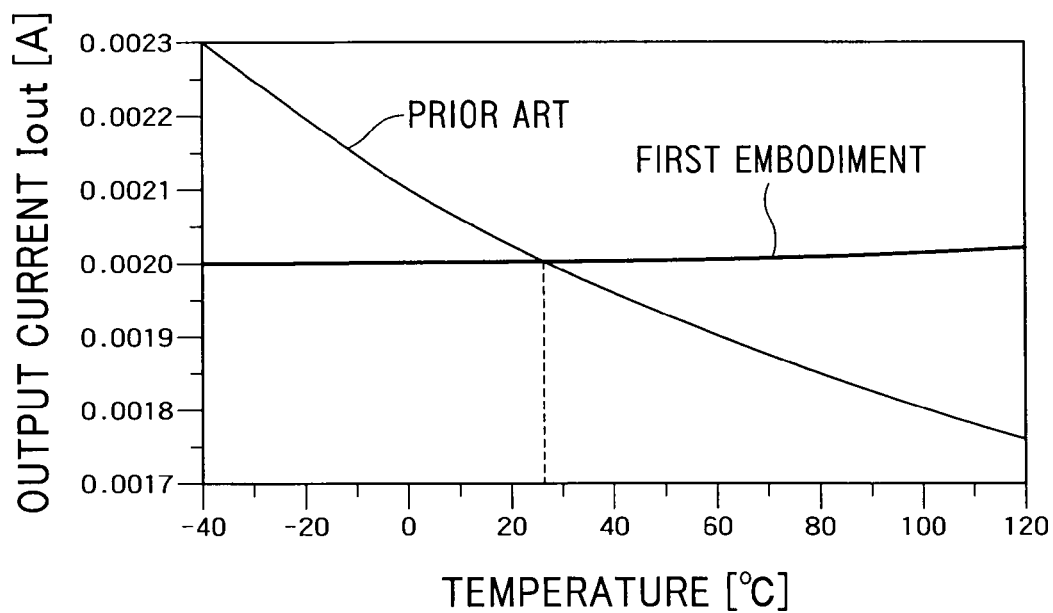
FIG. 3 shows the relationship between temperatures and output currents obtained by the current mirrors of the semiconductor integrated circuits according to the present embodiment and the prior art.

FIG. 3 shows the relationship between temperatures and output currents obtained by the current mirrors of the semiconductor integrated circuits according to the present embodiment and the prior art.

The results of FIG. 3 are obtained by a simulation in which a temperature is changed on the assumption that the resistive component 5 acts as a parasitic resistor on a metal wire and the parasitic resistor has temperature characteristics corresponding to a metal wire (copper) temperature coefficient. In the prior art for comparison, a resistor (not having temperature characteristics) is inserted between the ground and the source of the MOS transistor on the input side of the current mirror to compensate for a source potential.

As shown in FIG. 3, in the prior art, a current is correctly mirrored at room temperature (27° C.) because of the insertion of the resistor. The resistor does not have any temperature characteristics, whereas the parasitic resistor has temperature characteristics. Thus in the prior art, a source potential is not compensated and a current is not correctly mirrored at a temperature other than room temperature.

In the present embodiment, the output current is kept constant even when the temperature changes and it is found that the current is correctly mirrored. This is because when the resistance value is changed by the temperature characteristics of the resistive component 5, the first operational amplifier 6 controls the resistance value of the first variable resistor 4 to keep the first and second potentials V1 and V2 at an equal potential.

As described above, the semiconductor integrated circuit of the present embodiment makes it possible to current-mirror the reference current with higher accuracy.

In the present embodiment, the current mirror circuit of the semiconductor integrated circuit 100 is made up of the n-type MOS transistors. The current mirror circuit may be made up of p-type MOS transistors.

Second Embodiment

The first embodiment described a basic configuration for reducing output current variations caused by the resistive component between the output-side MOS transistor and the ground. The variations are reduced by controlling, by means of the operational amplifier, the variable resistor inserted between the input-side MOS transistor of the current mirror circuit and the ground.

The present embodiment will describe a configuration in which the above configuration is applied to an LNA using inductive degeneration. The LNA can achieve power matching and noise matching on the input by inductive source degeneration.

Figure 4:
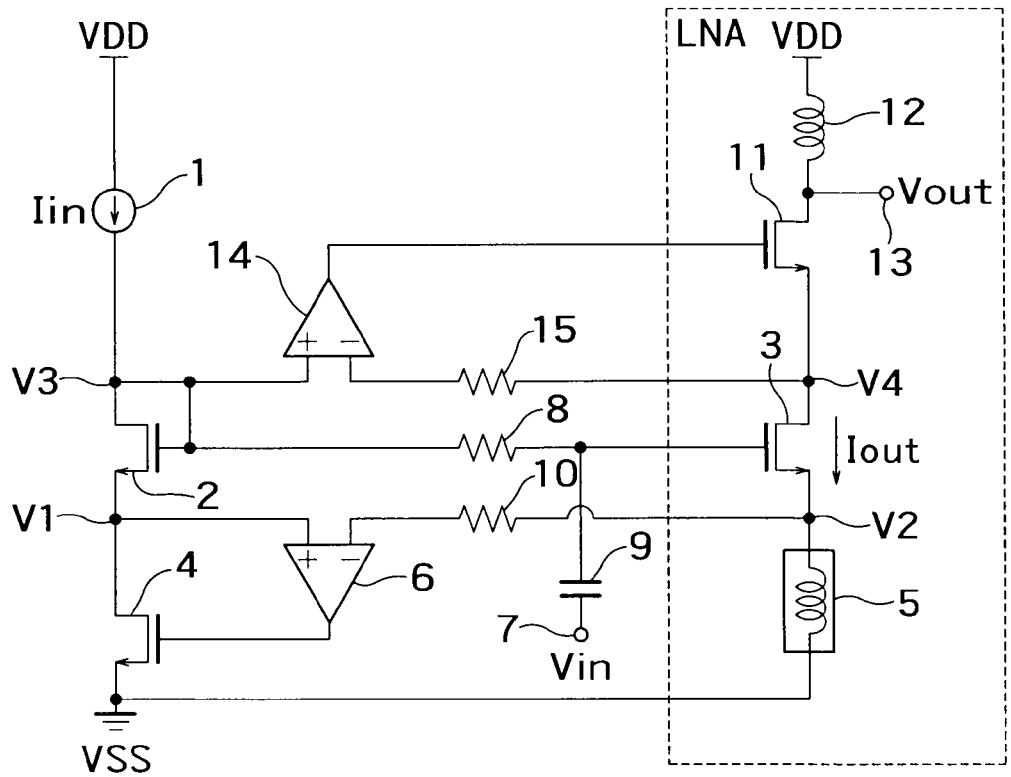
FIG. 4 shows the main configuration of a semiconductor integrated circuit 200 according to a second embodiment which is an aspect of the present invention.

FIG. 4 shows the main configuration of a semiconductor integrated circuit 200 according to a second embodiment which is an aspect of the present invention. In FIG. 4, the same reference numerals as those of FIG. 1 indicate the same configurations as those of the first embodiment.

As shown in FIG. 4, as in the first embodiment, the semiconductor integrated circuit 200 includes a current source 1 having one end connected to a power supply VDD and outputting a reference current Iin, a first MOS transistor 2 having one end (drain) connected to the other end of the current source 1 and acting as a n-type MOS transistor that is diode-connected, and a second MOS transistor 3 having the gate connected to the gate of the first MOS transistor 2 and acting as an n-type MOS transistor passing an output current Iout obtained by current-mirroring the reference current Iin.

The semiconductor integrated circuit 200 further includes, as in the first embodiment, a first variable resistor 4 connected between the other end (source) of the first MOS transistor 2 and a ground VSS and a resistive component 5 connected between the other end (source) of the second MOS transistor 3 and the ground VSS.

The resistive component 5 is an inductor (e.g., a spiral inductor) made up of a metal wire in the inductive degeneration of an LNA.

The semiconductor integrated circuit 200 further includes, as in the first embodiment, a first operational amplifier 6 having the non-inverting input terminal connected to the other end (source) of the first MOS transistor 2, the inverting input terminal connected to the other end (source) of the second MOS transistor 3, and the output connected to the gate of the MOS transistor composing the first variable resistor 4.

As in the first embodiment, the first operational amplifier 6 controls the first variable resistor 4 to reduce the resistance value when a first potential V1 is higher than a second potential V2 and to increase the resistance value when the first potential V1 is lower than the second potential V2.

Thus the semiconductor integrated circuit 200 can keep the first and second potentials V1 and V2 at an equal potential, thereby mirroring a reference current with higher accuracy.

The semiconductor integrated circuit 200 further includes an input terminal 7 fed with an alternating current signal Vin, a first resistor 8 connected between the gate of the first MOS transistor 2 and the gate of the second MOS transistor 3, and a capacitance 9 having one end connected between the first resistor 8 and the gate of the second MOS transistor 3 and the other end connected to the input terminal 7.

The semiconductor integrated circuit 200 further includes a second resistor 10 connected between the non-inverting input terminal of the first operational amplifier 6 and the other end (source) of the second MOS transistor 3, a load impedance 12 having one end connected to the power supply VDD and the other end connected to one end (drain) of the second MOS transistor 3 via a second variable resistor 11, and an output terminal 13 connected to the other end of the load impedance 12 to output a signal Vout obtained by amplifying the alternating current signal Vin.

As the load impedance 12, for example, an inductor (e.g., a spiral inductor made of a metal wire) is selected.

The semiconductor integrated circuit 200 further includes a second operational amplifier 14 having the non-inverting input terminal connected to the one end (drain) of the first MOS transistor 2, the inverting input terminal connected to one end (drain) of the second MOS transistor 3, and the output connected to the gate of the MOS transistor composing the second variable resistor 11, and a third resistor 15 connected between the inverting input terminal of the second operational amplifier 14 and the one end (drain) of the second MOS transistor 3.

The LNA is made up of the second MOS transistor 3, the resistive component 5 acting as an inductor, the load impedance 12, and the second variable resistor 11.

The second operational amplifier 14 compares a third potential V3 of the one end (drain) of the first MOS transistor 2 and a fourth potential V4 of the one end (drain) of the second MOS transistor 3 and outputs a signal for controlling the resistance value of the second variable resistor 11 to equalize the third potential V3 and the fourth potential V4.

Thus the resistance value of the second variable resistor 11 is controlled to equalize the third potential V3 and the fourth potential V4 and it is possible to reduce the influence of a channel length modulation effect on the one end (drain) of the second MOS transistor 3.

In use for high frequencies, a parasitic capacitance on each node may affect the characteristics. Thus in the present embodiment, as described above, the first to third resistors 8, and 15 having high resistances (about 20 kΩ) are inserted to isolate an alternating current signal component from the first and second operational amplifiers 6 and 14. Since potential control performed by the first and second operational amplifiers 6 and 14 does not require a high speed, the insertion of these resistors does not interfere with the effect.

In the case where the channel length modulation effect is not considered, the second variable resistor 11, the second operational amplifier, and the third resistor may be omitted as needed.

As describe above, according to the semiconductor integrated circuit of the present embodiment, it is possible to mirror the reference current with higher accuracy.

Third Embodiment

The second embodiment described an example of a configuration applied to an LNA using inductive degeneration. Particularly, the second embodiment described a configuration in which a drain potential is controlled by connecting the input of the second operational amplifier to the drain of the second MOS transistor of the LNA and detecting the drain potential.

The present embodiment will describe a configuration in which an LNA replica circuit is provided to control a drain potential, the input of a second operational amplifier is connected to the drain of the MOS transistor of the replica circuit, and the drain potential is indirectly detected.

Figure 5:
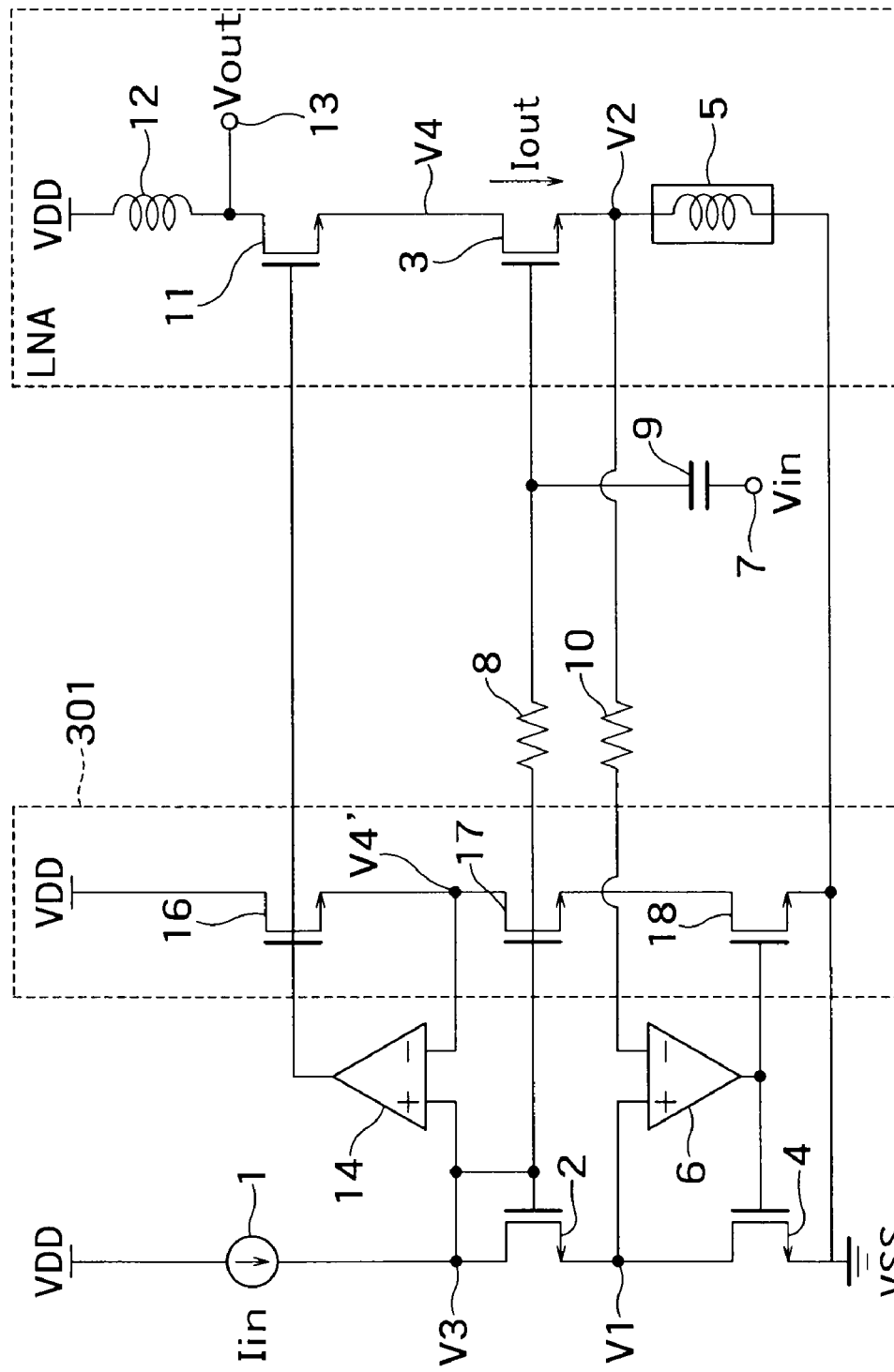
FIG. 5 shows the main configuration of a semiconductor integrated circuit 300 according to a third embodiment which is an aspect of the present invention.

FIG. 5 shows the main configuration of a semiconductor integrated circuit 300 according to a third embodiment which is an aspect of the present invention. In FIG. 5, the same reference numerals as those of FIG. 4 indicate the same configurations as those of the second embodiment.

As shown in FIG. 5, the semiconductor integrated circuit 300 includes an LNA replica circuit 301 for indirectly detecting the drain potential of a second MOS transistor 3.

The LNA replica circuit 301 includes a third MOS transistor 16 acting as an n-type MOS transistor having one end (drain) connected to a power supply VDD, a fourth MOS transistor 17 acting as an n-type MOS transistor having one end (drain) connected to the other end (source) of the third MOS transistor 16 and the gate connected between the gate of a first MOS transistor 2 and a first resistor 8, and a fifth MOS transistor 18 acting as an n-type MOS transistor having one end (drain) connected to the other end (source) of the fourth MOS transistor 17 and the gate connected to the gate of a MOS transistor composing a first variable resistor 4.

In order to equalize a voltage on each node of the LNA and the LNA replica circuit 301, the size ratio of the third MOS transistor 16 to the fourth MOS transistor 17 is set to be equal to the size ratio of the MOS transistor composing the second variable resistor 11 to the second MOS transistor 3. Further, the fourth MOS transistor 17 has the same size as the first MOS transistor 2. Moreover, the fifth MOS transistor 18 has the same size as the MOS transistor composing the first variable resistor 4.

Further, in the present embodiment, the second operational amplifier 14 has the non-inverting input terminal connected to one end (drain) of the first MOS transistor 2, the inverting input terminal connected to the one end (drain) of the fourth MOS transistor 17, and the output connected to the gate of the third MOS transistor 16 and the gate of the MOS transistor composing the second variable resistor 11.

The second operational amplifier 14 compares a third potential V3 of the one end (drain) of the first MOS transistor 2 and a fifth potential V4' of the one end (drain) of the fourth MOS transistor 17 and outputs a signal for controlling the third MOS transistor 16 to equalize the third potential V3 and the fifth potential V4'. At this point, the MOS transistor composing the second variable resistor 11 is similarly controlled by the signal, so that a fourth potential V4 and the fifth potential V4' are equalized based on the relationship of the size ratios. In other words, the MOS transistors are controlled to equalize the third potential V3 and the fourth potential V4.

Thus it is possible to reduce the influence of a channel length modulation effect on the one end (drain) of the second MOS transistor 3.

In the present embodiment, the third resistor 15 required for isolation in the second embodiment is not necessary and thus is not included in the present embodiment.

In the semiconductor integrated circuit 300 configured thus, the input of the second operational amplifier 14 is not connected to the one end (drain) of the second MOS transistor 3. Therefore, as compared with the second embodiment, it is possible to eliminate parasitism on the one end (drain) of the second MOS transistor 3.

As in the second embodiment, in the semiconductor integrated circuit 300 configured thus to be applied to the LNA, the resistance value of the variable resistor 4 is controlled by a first operational amplifier 6 and the first and second potentials V1 and V2 can be kept at an equal potential, thereby mirroring a reference current with higher accuracy.

As describe above, according to the semiconductor integrated circuit of the present embodiment, it is possible to mirror the reference current with higher accuracy.

What is claimed is:

1. A semiconductor integrated circuit, comprising:
   a current source having one end connected to a power supply and outputting a reference current;
   a first MOS transistor having a drain terminal connected to an other end of the current source and being diode-connected;
   a second MOS transistor having a gate connected to a gate of the first MOS transistor and passing an output current obtained by current-mirroring the reference current;
   a first variable resistor connected between a source terminal of the first MOS transistor and a ground;
   a resistive component connected between a source terminal of the second MOS transistor and the ground; and
   a first operational amplifier fed with a first potential of the source terminal of the first MOS transistor and a second potential of the source terminal of the second MOS transistor and outputting a signal for controlling a resistance value of the first variable resistor to equalize the first potential and the second potential,
   wherein the resistance value of the first variable resistor is controlled based on the output signal of the first operational amplifier, and
   wherein the resistive component is an inductor made up of a metal wire.

2. The semiconductor integrated circuit according to claim 1, further comprising:
   an input terminal fed with an alternating current signal;
   a first resistor connected between the gate of the first MOS transistor and the gate of the second MOS transistor;
   a capacitance having one end connected between the first resistor and the gate of the second MOS transistor and an other end connected to the input terminal;
   a second resistor connected between an input of the first operational amplifier and the other end of the second MOS transistor;
   a load impedance having one end connected to the power supply and an other end connected to one end of the second MOS transistor; and
   an output terminal connected to the other end of the load impedance and outputting a signal obtained by amplifying the alternating current signal.

3. The semiconductor integrated circuit according to claim 2, further comprising:
- a second variable resistor connected between the other end of the load impedance and the one end of the second MOS transistor;
- a second operational amplifier fed with a third potential of the one end of the first MOS transistor and a fourth potential of the one end of the second MOS transistor and outputting a signal for controlling a resistance value of the second variable resistor; and
- a third resistor connected between an input of the second operational amplifier and the one end of the second MOS transistor,
- wherein the resistance value of the second variable resistor is controlled based on the output signal of the second operational amplifier.

4. The semiconductor integrated circuit according to claim 1, wherein the first variable resistor is a MOS transistor having an on resistance fluctuating based on the output signal of the first operational amplifier.

5. The semiconductor integrated circuit according to claim 2 wherein the first variable resistor is a MOS transistor having an on resistance fluctuating based on the output signal of the first operational amplifier.

6. The semiconductor integrated circuit according to claim 3, wherein the first variable resistor is a MOS transistor having an on resistance fluctuating based on the output signal of the first operational amplifier.

7. The semiconductor integrated circuit according to claim 3, wherein the second variable resistor is a MOS transistor having an on resistance fluctuating based on the output signal of the second operational amplifier.

* * * * *